(12) United States Patent
Janssen

(10) Patent No.: US 6,300,757 B1
(45) Date of Patent: Oct. 9, 2001

(54) PROCEDURE FOR THE CALIBRATION OF A MEASURING DEVICE

(75) Inventor: Michael Janssen, Vilsheim-Kemoden (DE)

(73) Assignee: Texas Instruments Deutschland, GmbH, Freising (DE)

( * ) Notice: Subject to any disclaimer, the term of this patent is extended or adjusted under 35 U.S.C. 154(b) by 0 days.

(21) Appl. No.: 09/296,035

(22) Filed: Apr. 21, 1999

(30) Foreign Application Priority Data

Apr. 21, 1998 (DE) .............................. 198 17 763

(51) Int. Cl.⁷ .................................... G01R 31/28
(52) U.S. Cl. ................ 324/158.1; 324/765; 702/118; 702/121
(58) Field of Search .................... 324/601, 602, 324/158.1, 756, 74, 404; 438/14, 15, 16; 364/571.02; 702/85, 118, 121

(56) References Cited

U.S. PATENT DOCUMENTS

| | | | |
|---|---|---|---|
| 5,734,268 | * | 3/1998 | Bockelman ........................ 324/601 |
| 5,748,506 | * | 5/1998 | Bockelman ..................... 364/571.02 |
| 5,866,437 | * | 2/1999 | Chen et al. ........................... 438/14 |
| 5,884,236 | * | 3/1999 | Ito ......................................... 702/89 |
| 5,910,011 | * | 6/1999 | Cruse ..................................... 438/16 |
| 5,929,628 | * | 7/1999 | Becker et al. .................... 324/158.1 |
| 6,032,107 | * | 2/2000 | Hitchcock .......................... 324/73.1 |

FOREIGN PATENT DOCUMENTS

626588A1 * 11/1994 (EP) ............................. G01R/35/00

OTHER PUBLICATIONS

Dean A. Frickey, Member IEEE, Conversations Between S, Z, Y, h, ABCD, and T Parameters Which are Valid for Complex Source and Load Impedances, IEEE, vol. 42, No. 2, Feb. 1994, pp. 205–211.

Rual Yu, et al., Full Two–Port On–Wafer Vector Network Analysis to 120 GHz Using Active Probes IEEE, pp. 1339–1342, 1993.

\* cited by examiner

*Primary Examiner*—Glenn W. Brown
*Assistant Examiner*—Jimmy Nguyen
(74) *Attorney, Agent, or Firm*—William B. Kempler; Frederick J. Telecky, Jr.

(57) ABSTRACT

A method for the calibration of a measuring device for the measurement of RF parameters of integrated circuits on semiconductor wafers on which there are a large number of such integrated circuits, which is to be carried out as follows: A calibration semiconductor wafer is produced, containing integrated comparison circuit units which correspond to a plurality of characteristic circuit types, and which may be contacted via measuring points on the surface of the calibration semiconductor wafer. The S two-port parameters of each circuit unit on the calibration semiconductor wafer corresponding to any one circuit type are measured with precision. The measured S two-port parameters are stored. The calibration semiconductor wafer is inserted into the measuring device. The measuring device is then calibrated in such a way as to achieve an optimum impedance match at the measuring probe tips which will be brought into contact with the measuring points of the calibration semiconductor wafer.

6 Claims, 1 Drawing Sheet

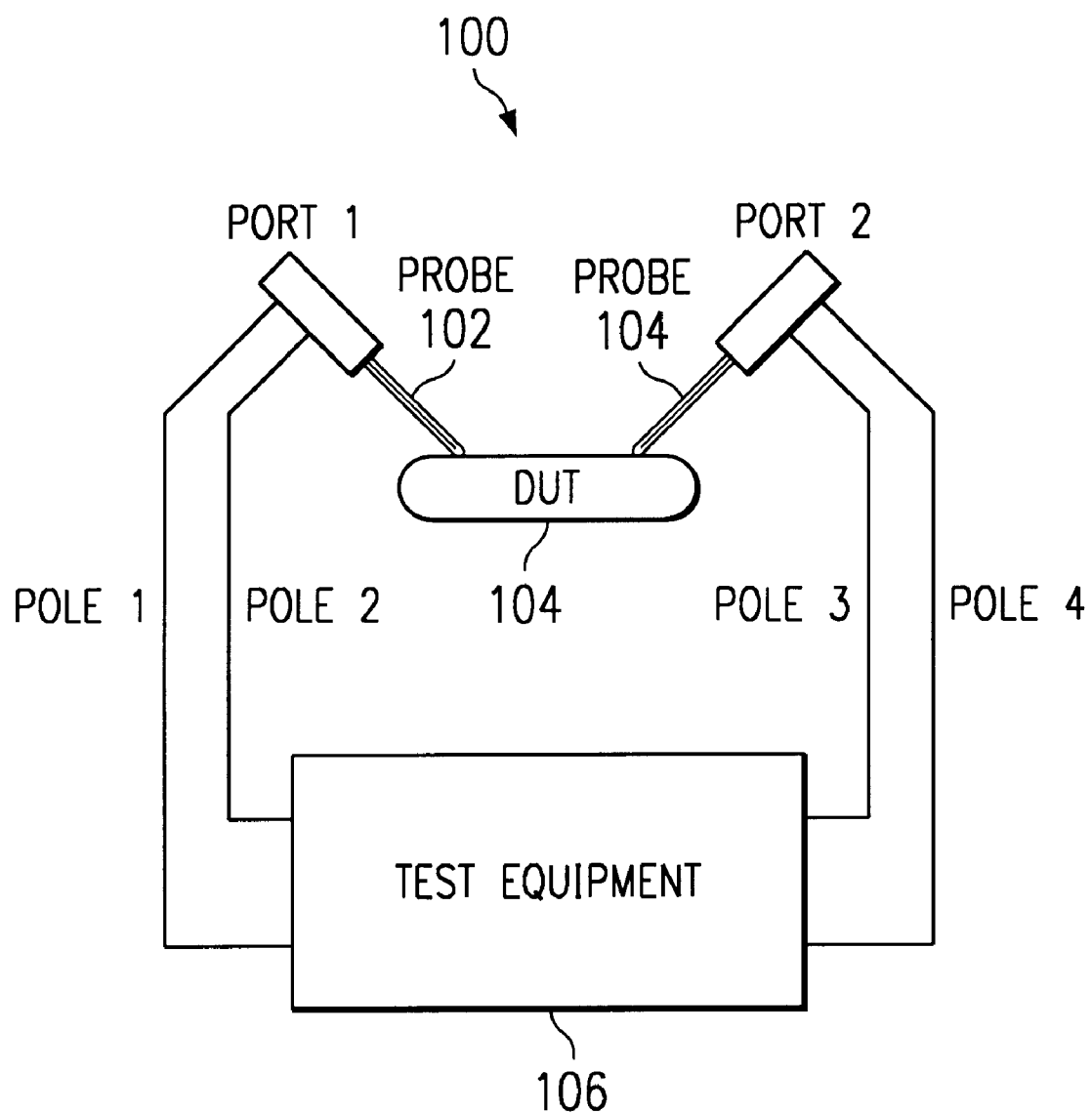

PROCEDURE FOR THE CALIBRATION OF A MEASURING DEVICE

The invention relates to a procedure for the calibration of a measuring device for the measurement of RF parameters of integrated circuits on semiconductor wafers on which there are a large number of such integrated circuits.

When manufacturing integrated circuits it is normal procedure to test the viability of the individual circuits whilst they are still on a semiconductor wafer on which there may be hundreds or even thousands of such circuits. For the purpose of testing, the wafer is inserted into a testing device, and connections to the points on the integrated circuits to be tested are made by means of pointed test probes. These test probes enable any desired current or voltage to be applied to the circuit, and output currents and voltages to be measured.

As long as the testing procedures involve direct currents and voltages, it is not difficult to obtain precise measuring results, since the measuring device itself has but a negligible effect on the measured values. However, when the integrated circuits are RF circuits whose RF behaviour is to be tested, considerable difficulties present themselves when it comes to the gathering of the four-pole parameters, responsible for the RF behaviour, with any precision, since the measuring device itself and in particular the connecting leads between the actual measuring devices and the measuring points on the integrated circuit will be the cause of considerable variations of the values measured, due to the well-known transformation processes involved. The difficulty, therefore, consists in gathering the four-pole parameters to be measured on the plane of the measuring points on the integrated circuit. This leads to the requirement that the measuring device should be calibrated in such a way as to register the actual four-pole parameters as present on the plane of the measuring probes on the integrated circuit, instead of the values present at the output ends of the leads connecting to the measuring devices. Such a new calibration process must be carried out each time a test configuration is changed, as, for example, when changing the measuring point contact positions on the integrated circuit.

Calibration substrates with precisely known four-pole parameters, suitable for the calibration of such a measuring device, are certainly available, but these substrates are ceramic substrates with evaporation-deposited circuits and circuit elements which are inserted into the testing device and which are then used to carry out a calibration process. In the case of such a calibration process it is, however, not possible to reproduce exactly the actual geometrical conditions prevailing on a semiconductor wafer in the course of testing an integrated circuit. It follows, therefore, that a precise calibration of the measuring device at the plane of the measuring points contacted is not possible when using such ceramic substrates with standard circuit elements. Furthermore, these ceramic substrates are extremely expensive, and up to now it was almost impossible to use such calibration substrates for all possible application requirements.

The invention, therefore, is to satisfy the requirement for the provision of a calibration process of the type previously described which is not costly and yet allows the precise calibration of the measuring device at the plane of the measuring probes on the integrated circuit, even allowing for different measuring configurations.

According to the invention, this purpose is achieved by carrying out the calibration process in accordance with the following step-by-step procedure:

a) A calibration semiconductor wafer is produced, containing integrated comparison circuit units which correspond to a plurality of characteristic circuit types, and which may be contacted via measuring points on the surface of the calibration semiconductor wafer;

b) the stray parameters of each circuit unit on the calibration semiconductor wafer corresponding to any one circuit type are measured with precision;

c) the measured stray parameters are stored;

d) the calibration semiconductor wafer is inserted into the measuring device;

e) the measuring device is then calibrated in such a way as to achieve an optimum impedance match at the measuring pro be tips which will be brought into contact with the measuring points of the calibration semiconductor wafer.

An advantageous embodiment of the invention is characterised in that a plurality of comparison circuit units for each circuit type are produced on the calibration semiconductor wafer, and that the stray parameters of these comparison circuit units are determined after the calibration of the measuring device with the aid of circuit units whose stray parameters have been precisely measured, that these are then stored together with their position on the calibration semiconductor wafer, and that the measuring device is then calibrated by using one of the several comparison circuits provided. This embodiment makes it possible to use the calibration semiconductor wafer for many calibration processes, even when the measuring points on the circuit units with which the measuring probes are to make contact have become unusable on account of mechanical wear. In spite of this, it will only be necessary to make one single precise measurement of the four-pole parameters of a circuit unit for each circuit type, since the four-pole parameters of all the other similar circuit units can be determined by reference to the corresponding measured circuit units.

In the case of the procedure according to the invention, a calibration semiconductor wafer is first produced, on which are arranged comparison circuit units in the form of integrated circuits. These comparison circuit units correspond to characteristic circuit types on which the four-pole parameters, that is the stray parameters, can be measured. Typical circuit types are here resistive configurations with a specific impedance, such as a 50 Ohm resistor, a short circuit, an open circuit, resistive configurations with a resistance different from 50 Ohms, such as perhaps a 25 Ohm resistor or a 75 Ohm resistor or similar. In the case under consideration, not only one circuit unit of each of these circuit types is produced on the semiconductor wafer, but a large number of them, perhaps 200, to give an example. The purpose of this measure will be explained in more detail later on.

As a next process step, each one of the circuit types will have to be measured to determine their four-pole parameters. The expense and the resources used in the course of this measuring process are well justified, since it has to be carried out only once and only on one of the units of each circuit type. The measured values for the four-pole parameters will then be stored. Now the calibration semiconductor wafer is inserted into the measuring device which is to be used for the testing of the integrated circuits. The probe tips of the measuring device are brought into contact with the measuring points of the circuit units whose four-pole parameters have been determined with precision beforehand. The measuring device is now calibrated in such a way as to achieve an optimum impedance match at the measuring point, that is at the measuring plane between the probe tips and the measuring points on the calibration semiconductor wafer. This calibration process ensures that the measuring device cannot alter the values measured, at the measuring plane, through transformation. By means of this calibration process it is possible to determine the degree of influence the measuring device has on the values gathered at the measuring plane. This means that this influence can then be eliminated during the subsequent testing of the integrated circuits by means of suitable calculations, so that it becomes possible to gather the actual measuring value which obtains at the measuring plane, that is at the contact point between the measuring probes and the contact surfaces of the integrated circuit.

The calibration process, which is carried out by the use of the measuring device and where are the measuring probes are placed on the contact surfaces forming the measuring points, cannot be repeated indefinitely since the electrical properties of the contact surfaces suffer alteration through the mechanical wear caused by the contact with the measuring probes. In practice it has been found that the same contact surfaces can only be used four times at most, until a noticeable alteration of the electrical properties becomes apparent. To avoid the need of having to produce and put to use a new semiconductor wafer each time the contact surfaces of the circuit unit used in the calibration process become worm, a plurality of circuit units, for example 200, of each circuit type are produced, as has been previously mentioned. To enable these circuit units to be used in a calibration process, their four-pole parameters must be known. However, these four-pole parameters can be determined in a simple way. As has been mentioned before, when using the process here described, one circuit unit of every circuit type was measured with great precision, so that their four-pole parameters are precisely known. After this measuring process, the calibration semiconductor wafer can be inserted into the measuring device, and the above-described calibration process can be carried out, using these precisely measured circuit units. After calibration, the four-pole parameters of all the other circuit units of the various circuit types on the calibration semiconductor wafer, and even other calibration semiconductor wafers produced at a later date, can be measured in the measuring device, and the four-pole parameters of the corresponding circuit units at the various positions on the calibration semiconductor circuit may be stored in tabular form. This means that the four-pole parameters of all the circuit units on the calibration semiconductor wafer are now known, so that they may find used as calibrations standards in future calibration processes, just like the circuit units whose four-pole parameters have been exactly determined. The calibration semiconductor wafer can therefore be used much more often for calibration purposes than would be the case if only one precisely measured circuit unit of each circuit type were available.

It has therefore been shown that only one single precise measurement of the four-pole parameters of one circuit unit of each circuit type is required for the calibration process to succeed. Each calibration process can then be carried out by using the measured values obtained in the course of the initial calibration of the measuring device with the calibration semiconductor wafer inserted.

What is claimed is:

1. Method for the calibration of a measuring device for the measurement of RF parameters of integrated circuits on semiconductor wafers on which there are a large number of such integrated circuits comprising the steps of:
   a) a calibration semiconductor wafer is produced, containing integrated comparison circuit units which correspond to a plurality of characteristic circuit types, and which may be contacted via measuring points on the surface of the calibration semiconductor wafer;
   b) four-pole parameters of each circuit unit on the calibration semiconductor wafer corresponding to any one circuit type are measured with precision;
   c) measured four-pole parameters are stored;
   d) the calibration semiconductor wafer is inserted into the measuring device;
   e) the measuring devices are then calibrated to achieve an impedance match at the measuring probe tips which will be brought into contact with the measuring points of the calibration semiconductor wafer.

2. Method according to claim 1, wherein a plurality of comparison circuit units for each circuit type are produced on the calibration semiconductor wafer, and that the four-pole parameters of these comparison circuit units are determined after the calibration of the measuring device with the aid of circuit units whose four-pole parameters have been precisely measured, that these are then stored together with their position on the calibration semiconductor wafer, and that the measuring device is then calibrated by using one of the several comparison circuits provided.

3. Method for the calibration of a measuring device for the measurement of RF parameters of integrated circuits on semiconductor wafers on which there are a large number of such integrated circuits comprising the steps of:
   a) a calibration semiconductor wafer is produced, containing integrated comparison circuit units which correspond to a plurality of characteristic circuit types, and which may be contacted via measuring points on the surface of the calibration semiconductor wafer;
   b) S parameters of each circuit unit on the calibration semiconductor wafer corresponding to any one circuit type are measured with precision;
   c) measured S parameters are stored;
   d) the calibration semiconductor wafer is inserted into the measuring device;
   e) the measuring devices are then calibrated to achieve an impedance match at the measuring probe tips which will be brought into contact with the measuring points of the calibration semiconductor wafer.

4. Method according to claim 3, wherein a plurality of comparison circuit units for each circuit type are produced on the calibration semiconductor wafer, and that the S parameters of these comparison circuit units are determined after the calibration of the measuring device with the aid of circuit units whose S parameters have been precisely measured, that these are then stored together with their position on the calibration semiconductor wafer, and that the measuring device is then calibrated by using one of the several comparison circuits provided.

5. Method for the calibration of a measuring device for the measurement of RF parameters of integrated circuits on semiconductor wafers on which there are a large number of such integrated circuits comprising the steps of:
   a) a calibration semiconductor wafer is produced, containing integrated comparison circuit units which correspond to a plurality of characteristic circuit types, and which may be contacted via measuring points on the surface of the calibration semiconductor wafer;
   b) two port parameters of each circuit unit on the calibration semiconductor wafer corresponding to any one circuit type are measured with precision;
   c) measured two port parameters are stored;
   d) the calibration semiconductor wafer is inserted into the measuring device;
   e) the measuring devices are then calibrated to achieve an impedance match at the measuring probe tips which will be brought into contact with the measuring points of the calibration semiconductor wafer.

6. Method according to claim 5, wherein a plurality of comparison circuit units for each circuit type are produced on the calibration semiconductor wafer, and that the two port parameters of these comparison circuit units are determined after the calibration of the measuring device with the aid of circuit units whose two port parameters have been precisely measured, that these are then stored together with their position on the calibration semiconductor wafer, and that the measuring device is then calibrated by using one of the several comparison circuits provided.

* * * * *